United States Patent
Mizushima et al.

(10) Patent No.: US 6,884,154 B2
(45) Date of Patent: Apr. 26, 2005

(54) METHOD FOR APPARATUS FOR POLISHING OUTER PERIPHERAL CHAMFERED PART OF WAFER

(75) Inventors: Kazutoshi Mizushima, Fukushima (JP); Nakaji Miura, Fukushima (JP); Yasuhiro Sekine, Fukushima (JP); Makoto Suzuki, Fukushima (JP); Kazuya Tomii, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 91 days.

(21) Appl. No.: 09/959,315

(22) PCT Filed: Feb. 21, 2001

(86) PCT No.: PCT/JP01/01266

§ 371 (c)(1),
(2), (4) Date: Jan. 25, 2002

(87) PCT Pub. No.: WO01/62436

PCT Pub. Date: Aug. 30, 2001

(65) Prior Publication Data

US 2003/0054739 A1 Mar. 20, 2003

(30) Foreign Application Priority Data

Feb. 23, 2000  (JP) ........................................ 2000-045777

(51) Int. Cl.⁷ ................................................ B24B 1/00
(52) U.S. Cl. .......................... 451/44; 451/41; 451/42; 451/57; 451/60; 451/177; 451/179; 451/289; 451/209; 451/210; 451/397; 451/402; 451/403

(58) Field of Search .............................. 451/41, 42, 44, 451/57, 60, 177, 179, 289, 209, 210, 397, 402, 403

(56) References Cited

U.S. PATENT DOCUMENTS

| 5,316,620 | A | * | 5/1994 | Hasegawa et al. | .......... 156/645 |
| 5,571,373 | A | * | 11/1996 | Krishna et al. | ............. 438/693 |
| 5,727,990 | A | * | 3/1998 | Hasegawa et al. | ............ 451/44 |
| 5,882,539 | A | * | 3/1999 | Hasegawa et al. | ............ 216/88 |
| 6,306,016 | B1 | * | 10/2001 | Steere, Jr. et al. | ............ 451/44 |

* cited by examiner

Primary Examiner—Joseph J. Hail, III
Assistant Examiner—Shantese McDonald
(74) Attorney, Agent, or Firm—Crowell & Moring LLP

(57) ABSTRACT

In a process for polishing the chamfered peripheral part of a wafer using a polishing cloth while supplying a polishing slurry in order to improve productivity of the process by reducing a polishing time, at least two steps of polishing processes are performed in sequence. The process comprises a first polishing process to polish a particular part, e.g. the part corresponding to the {110} plane of a peripheral part of the wafer and a second polishing process in which the whole part of a peripheral part of the wafer is polished for finishing by means of varying a hardness of the polishing clothes and/or a particle size of abrasives in the slurry such as the hardness of the polishing cloth in the second polishing process being softer than that of in the first polishing process and a particle size of abrasives in the slurry in the second polishing process being finer than that of in the first polishing process.

11 Claims, 4 Drawing Sheets

US 6,884,154 B2

METHOD FOR APPARATUS FOR POLISHING OUTER PERIPHERAL CHAMFERED PART OF WAFER

BACKGROUND OF THE INVENTION

1. Fields of the Invention

The present invention relates to a method for mirror polishing the chamfered peripheral part of a wafer and an apparatus for the same.

2. Description of the Related Art

The manufacturing process for mirror wafers of such as silicon semiconductor or compound semiconductor, is outlined as follows. A single crystal ingot first manufactured by pulling method or the like, is sliced into disc shape to obtain as-sliced wafers Subsequently, a lapping process is conducted in order to produce a flatness of the surface and a parallelism between the front and back surfaces of the as-sliced waters by grinding extremely uneven layers produced in the slicing process As the wafer having gone through these mechanical processes have a damage layer, that is, a deteriorated layer by mechanical impact on its surface, that layer is removed by chemical etching. To finish the wafer process, the wafer is polished to a mirror surface.

Thus produced semiconductor mirror wafer is carried into next process of device manufacturing. The device manufacturing process includes a substrate process, a wiring process and a test process. An essential substrate structure of a device is formed on a wafer in the substrate process. The processed substrate is put into a next wiring process for forming a further device structure such as wiring patterns. The substrate is cut into device chips that are delivered to an assembly process.

Most of these works for processing are wafers as seen through the processes from a single crystal ingot to a semiconductor device. Wafers are used as works not only in the mirror wafer manufacturing process but in the device fabricating process also. Thus, wafers are handled even in both the substrate process and the wiring process of device fabrication Operations utilizing the peripheral part of wafers are frequently repeated therethrough. Consequently, if the wafer has a sharp peripheral edge of a right angle as it is cut, it is liable to give rise to mechanical defects such as chips and cracks which further cause particles attaching on the surface of the wafer to result in a bad production yield of the subsequent process.

If the peripheral part of the wafer has a coarse surface, chemicals used in an etching process are not perfectly cleaned so as to affect the subsequent process defectively. Further, when the single crystal wafer is subjected to epitaxial growth on its major surface in order to increase a value added as a product in a wafer manufacturing industry, the irregular and defective crystal arrangement of the peripheral surface may generate epitaxial crown (continuous protuberant crystal growth) on the edge part of the major surface or plurality of protrusions called nodule. Therefore, great emphasis is laid not only upon processing of the main surface but also processing of the peripheral part. It is common that the peripheral part of the wafer these days is polished like a mirror surface in addition to being chamfered as a highly finished state of the surface to avoid chipping.

Thus, in a chamfering process for the peripheral part of the wafer, the peripheral part is first ground in accordance with the sectional profile of it before a polishing process in order to prepare a chamfered form thereof. Fragmental abrasive grains broken from the grindstone or the deformation of the grindstone in this process causes deep scratches on the surface. Therefore, the surface needs to be polished at least as deep as to remove the scratches.

The peripheral parts of wafers are often polished with a tape having abrasive grains thereon in order to lighten the load on the polishing process using polishing cloth As the process with the tape brings more damages on the surface than the process with the polishing cloth, polishing with polishing cloth need to be done carefully after all to get rid of the damages perfectly.

The chamfered peripheral part of the wafer consists of different planes of crystal orientation though the major surface has a definite single plane. As a reactivity of alkaline etching solution to silicon differs according to the crystal orientation of silicon, that is anisotropic in nature, surface roughness is different by the positions of the chamfered part of the water when the chamfered part is etched by alkaline etching. As shown in FIG. 1, the chamfered part of the (100) wafer have {100} planes or {110} planes at 45-degree angular intervals. When it is etched, though the chamfered part of {110} plane position becomes severely rough, the chamfered part of {100} plane position dose not become much so. Such a wafer needs to be polished over the chamfered part based on its surface roughness of the {110} plane position.

Up to now, the chamfered peripheral part of a wafer has usually been polished by a process of a single condition that is commonly called one-step polishing. On the contrary, the major surface of a wafer has ordinarily polished by a plurality of processes of different conditions, that is multi-step polishing processes, in order to strictly pursue both the removal of damages induced by processing and the improvement for the surface roughness. That is because the improvement can not be attained by a single condition as the major surface has different characteristics of unevenness such as flatness, waviness, ripple or haze, the major surface has been polished with the different rate of polishing at each step so as to meet each problem. On the other hand, the problems are roughness and damages induced by processing as far as the peripheral part of the wafer is concerned. Thus the peripheral part of a wafer have been hitherto polished by one step.

Such an apparatus as shown in FIG. 4 have been used for polishing the chamfered peripheral part of a wafer. The apparatus has a rotating drum affixed with a polishing cloth thereon, a wafer rotating part which press the chamfered peripheral part of the wafer against the rotating drum while rotates the wafer thereon and a nozzle which supplies polishing slurry to the contact spot of the polishing cloth to the chamfered peripheral part of the wafer.

As requirement for high-quality of the peripheral part of a wafer becomes strict, the high level of improvement on the roughness and damages induced by processing is also required. Therefore polishing time of the peripheral part becomes so long that a problem arises regarding a life of polishing cloth. Consequently, these issues give rise to the necessity of the improvement in terms of productivity and cost in the process. In a polishing process with a single condition, the peripheral part has often been polished excessively in order to equalize different surface spots of different surface roughness, which has led to reduction of productivity.

SUMMARY OF THE INVENTION

The present invention has been made in view of the above-mentioned problems and has an object of reducing polishing time and improving productivity in a polishing process for the chamfered peripheral part of a wafer.

The present invention is characterized by that in a polishing process for polishing the chamfered peripheral part of a wafer with polishing cloth while supplying polishing slurry, a method comprises steps of preparing a plurality of processes having different polishing rates and performing the chamfered peripheral part polishing by a process sequence so that a polishing rate of each process is reduced in sequence.

The present invention aims at rapidly extinguishing large surface roughnesses and deep scratches. Thus the chamfered peripheral part of a wafer is first polished by means of a rapid rate but giving a rough finish surface and then put a finish polishing on when the whole surface state becomes uniform so as to finish up to be a high grade surface of the chamfered peripheral part that has no process damages and small surface roughnesses. Hence the polishing time is extremely reduced and the productivity increases.

At least two steps of polishing rates need to be combined regardless the transfer stage between rough polishing process and finish polishing process being continuous or stepwise. The method is characterized by having at least a first polishing process in which the chamfered part is polished at a condition of the polishing rate of abundant stock removal and a second polishing process for finishing to a mirror surface. The steps of polishing with polishing cloth herein are not restricted to two steps but three steps or more are possible.

As described above, a particular part of a peripheral part of a wafer is susceptible to rough surface. Therefore a polishing can be performed by two separate steps of the first polishing process in which the particular part of a peripheral part of the wafer is polished and the second polishing process in which the whole part of a peripheral part of the wafer is polished for finishing. At this time, only {110} plane can be polished in case the particular part of the peripheral part of the wafer is {110} plane or the peripheral part can be polished on the condition that the part corresponding to the {110} plane is selectively polished. For example, the peripheral part is polished by changing a polishing pressure or a holding time of attaching to the polishing cloth and so on with regard to the part being {110} plane or not. Thus, when the part of {110} plane becomes indistinguishable from the other part, then the whole part of the peripheral part is successively polished for finishing, which leads to reduction of process time and improving productivity.

Further, the present invention is characterized by that polishing conditions are changed among a plurality of processes which consists of at least two polishing processes by changing a hardness of the polishing cloth and/or a particle size of the abrasives in the polishing slurry. These aforementioned conditions along with the polishing rate are important factors to determine the surface roughness and are also easily changeable.

More specifically, in the above mentioned method, it is also a feature of the present invention to use in the second polishing process the polishing cloth hating a hardness softer than that in the first polishing process.

Similarly, it is also a feature of the present invention to use in the second polishing process a polishing slurry having a smaller particle size of the abrasives in the polishing slurry than that in the first polishing process. Otherwise, a kind of abrasives in the polishing slurry can be varied such as in the first polishing process with a fumed silica having high polishing capability and then in the second polishing process With a colloidal silica of small particle size still more capable of improving surface roughness.

Though the polishing apparatus can be varied to conduct the present invention as embodiments, a polishing apparatus for polishing the chamfered peripheral part of wafers used herein comprises a rotating drum affixed with a polishing cloth thereon, a wafer rotating part which push the chamfered peripheral part of the wafer to the rotating drum while rotating the wafer, a linear moving means which moves the rotating drum and the wafer rotating part relatively in up and down directions along the axis of the rotating drum, a nozzle which supplies polishing slurry to the contact spot of the cloth to the wafer.

The chamfered peripheral part of the wafer is polished using two sets of the rotating drum type polishing apparatus adjusted with at least different processing pressures or wafer rotating rates and the polishing is performed successively by changing the values of the hardness of the polishing cloth and/or kinds of slurry at each polishing apparatus.

Further, using an apparatus having two rotating drums and each attached nozzles for supplying slurry, i.e. a twin type apparatus, a polishing can similarly be carried out in such a manner that the chamfered peripheral part of the water is pushed to a plurality of the rotating drums in sequence by changing the values of the hardness of the polishing cloth and/or kinds of slurry.

In accordance with the present invention, as an apparatus capable of performing rapidly and effectively the method of the present invention, in a polishing apparatus for polishing the chamfered periphery part of a wafer having a rotating drum affixed with a polishing cloth thereon, a wafer rotating part which press the chamfered peripheral part of the wafer against the rotating drum while rotates the wafer on it and a nozzle which supplies polishing slurry to the contact area of the polishing cloth to the chamfered peripheral part of the wafer, an apparatus is presented which is characterized by that the apparatus has a rotating drum affixed with a plurality of polishing clothes having different values of hardness thereon, a relative linear moving means which relatively moves a polishing spot on the clothes in the direction parallel to the affixed plane of the clothes wherein the moving range of the relative linear moving means is at least a wafer moving distance between the polishing spots of different clothes of a plurality of the polishing clothes.

It is therefore preferable that the varying direction of a plurality of affixed polishing clothes and the moving direction of the relative moving means are in the direction of the rotating axis of the drum. In other words, the apparatus is constructed so as to vary the values of hardness of the cloths affixed to the rotating drum at a plurality of steps in the direction of the axis of the rotating drum in order to vary the value of hardness at a plurality of steps on each polishing spot of cloth to the chamfered peripheral part of the wafer by the relative linear moving means. The values of hardness may preferably be changed by two steps for the sake of convenience and comprehension.

In addition, the nozzle which supplies polishing slurry has preferably a changing means to change kinds of slurry on the way of processing. The relative linear moving means having a hydraulically-operated cylinder, an air cylinder or a combination of a motor and a guide rail can also used.

THE BEST MODE FOR CARRYING OUT THE INVENTION

The invention will now be described by way of example with reference to the accompanying drawings. It should be understood, however, that the description herein of specific embodiments such as to the dimensions, the kinds of material, the configurations and the relative disposals of the elemental parts and the like is not intended to limit the invention to the particular forms disclosed but the intention is to disclose for the sake of example unless otherwise specifically described.

Figure 4:
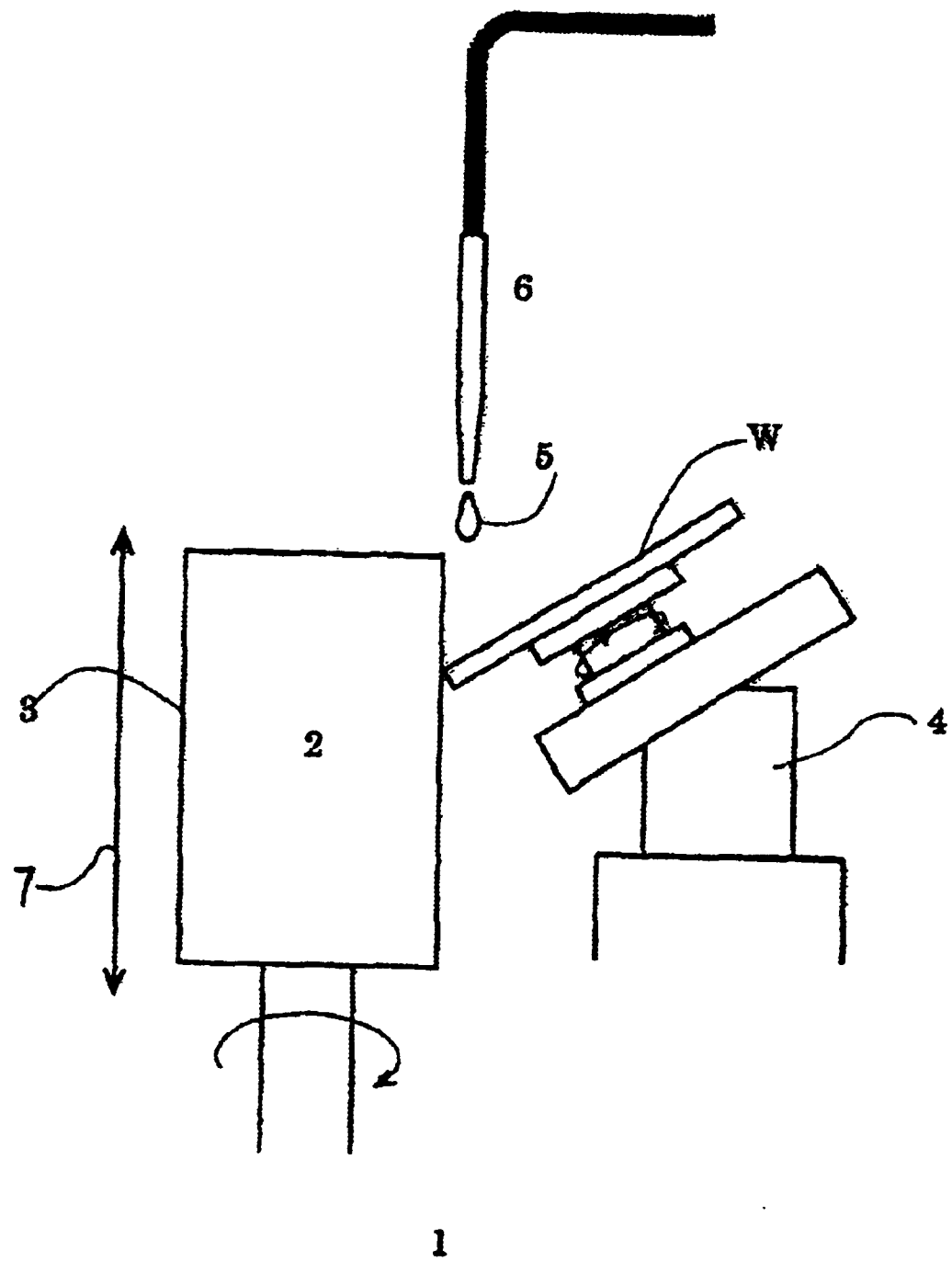
FIG. 4 is a schematic drawing of one illustrative embodiment of apparatus for polishing chamfered peripheral part of wafer employing the prior art.

A polishing apparatus 1 for polishing the chamfered peripheral part of a wafer W, as shown in FIG. 4, wan used for the following example 1, 3 and comparative example 1, 2. The polishing apparatus 1 comprises a rotating drum 3 affixed with a polishing cloth 2 to the surface thereof, a wafer rotating part 4 which press the chamfered peripheral part of the wafer W against the rotating drum 3 with a definite angle while rotates the wafer thereon, a linear moving means which moves the rotating drum and the wafer rotating part relatively in up and down directions along the axis of the rotating drum 3, and a nozzle 6 which supplies polishing slurry 5 to the contact spot of the polishing cloth to the chamfered peripheral part of the wafer W. The polishing apparatus 1 is also capable of controlling variably the wafer rotating rate and the processing pressure.

A silicon wafer having 200 mm diameter and (100) plane orientation sliced from an ingot was chamfered ordinarily by grind stone, lapped and etched by alkaline solution. Thus obtained wafers were used for the following experiments. The surface roughness of this wafer was 60~90 nm when measured by cut off 20 μm with an optical roughness gauge of Chapman MP2000+.

COMPARATIVE EXAMPLE 1

Polishing was performed by a conventional single step. As for a polishing condition, a non-woven type polishing cloth having Asker C hardness of about 72 (the value measured by an Asker C hardness scale which is a kind of a spring hardness scale) and an alkaline polishing slurry containing colloidal silica of large particle size(60 nm average particle size) were used. The drum was rotated at a rate of 800 rpm. This condition for polishing has a high polishing rate but gives relatively large polishing damages.

COMPARATIVE EXAMPLE 2

Another polishing was performed also by a conventional single step but with another condition. As for a polishing condition, a non-woven type polishing cloth having Asker C hardness of about 62 softer than that in Comparative Example 1 and an alkaline polishing slurry containing finer colloidal silica (30 nm average particle size) were used. The drum was rotated at a rate of 800 rpm. Hence the surface roughness was taken into consideration with this condition for polishing.

EXAMPLE 1

Using two sets of polishing apparatuses shown in FIG. 4, polishing for the chamfered peripheral part of a wafer was performed with a first polishing apparatus on the similar condition to that of Comparative Example 1 by rotating the wafer at 40 seconds per round as a rough polishing (a first polishing) and then with a second polishing apparatus on the similar condition to that of Comparative Example 2 as a fine polishing (a second polishing). The two separate sets of polishing apparatuses herein were constructed so as to be changed in sequence at the time of the first polishing and then the second polishing and so that the chamfered part of the wafer was contacted to each drum at the same set value of polishing pressure.

In the above described examples and comparative examples, the polishing was operated by rotating the wafer only one round at an operation and the surface roughness of the polishing part was measured. The shorter the time for one round, i.e. the more rapid the rotating rate was, the shorter was the time for holding to contact the wafer with the cloth, which resulted in the more incomplete polishing to give the more unimproved surface roughness. In the above described examples and comparative examples, an average roughness (Ra) at the polished part on each polishing condition with respect to the time for one round of the wafer was measured and results were plotted on the graph shown in FIG. 3. Comparative Example 1 illustrates that 40 seconds per one round of wafer gave rise to an improvement of 20 nm roughness but more prolonged time did not produce further improvement regarding the surface roughness Comparative Example 1 illustrates that over 140 seconds polishing time is necessary in order to give an improvement of 5 nm roughness.

In an example 1 of the present invention, the first polishing on the similar condition to comparative example 1 by rotating at a rate of 40 seconds per one round was followed by the second polishing on the similar condition to comparative example 2. With total polishing time of 80 seconds (=the first 40+ the second 40), improvement was made up to 5 nm which was 15 nm finer than the result of comparative example 1 by the same time duration.

Figure 3:
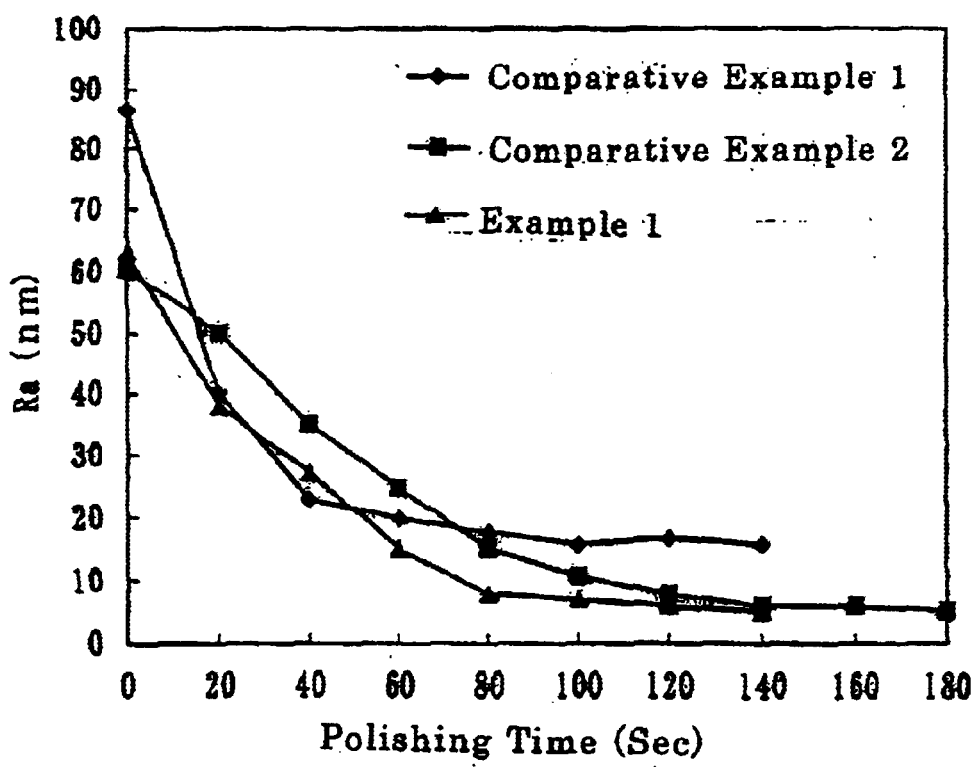
FIG. 3 is a graph depicting the relation between the average roughness and the polishing time as a result of a first embodiment of the present invention and a first and second comparative examples.

As shown in FIG. 3, a level of surface roughness which reached to a saturated value when polished at high polishing rate was bad (comparative example 1), on the contrary, when polished at low polishing rate, the level is good (comparative example 2). Considering these factors, the number of steps of polishing processes and the timing to change each polishing processes should have been decided. When a polishing process of the present invention having at least tow steps polishing was conducted, a current polishing process was effectively changed to a next polishing process at the time or just before the time when the level of roughness on the current process reached to an invariable saturated value, the process being followed by the successive steps having a condition capable of making finer surface. Steps of polishing processes could be determined appropriately by the allowed polishing time and surface roughness.

EXAMPLE 2

A second illustrative embodiment of the present invention will now be described with reference to FIG. 2.

A polishing apparatus 11 comprises a rotating drum 13 affixed with a polishing cloth 12 to the surface thereof, a wafer rotating part 14 which press the chamfered peripheral part of the wafer W against the rotating drum 13 while rotates the wafer thereon, a linear moving means which moves the rotating drum and the wafer rotating part relatively in up and down directions along the axis of the rotating drum 13 as illustrated by the arrow 7, and a nozzle 16 which supplies polishing slurry 15 to the contact spot of the polishing cloth to the chamfered peripheral part of the water W. The polishing apparatus 1 is also capable of controlling variably the wafer rotating rate and the processing pressure. Further, the polishing cloth 12a, 12b affixed to the rotating drum varied by two steps along the direction of the rotating axis of the rotating drum so as to vary the hardness of the polishing clothes at the spot of polishing of the chamfered peripheral part of the wafer by moving with the linear moving means. For example, the polishing cloth 12b was affixed to the upper section of the peripheral plane of the drum and 12a to the lower section thereof, each hardness being different.

Figure 1:
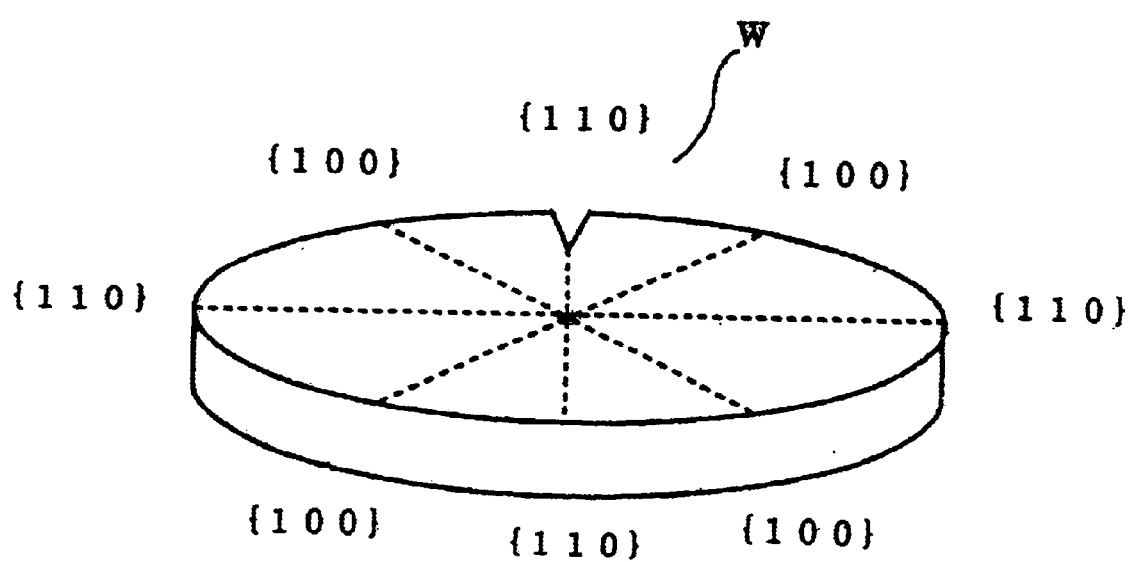
FIG. 1 is a schematic drawing which depicts crystal planes of a chamfered peripheral part of a silicon water.
Figure 2:
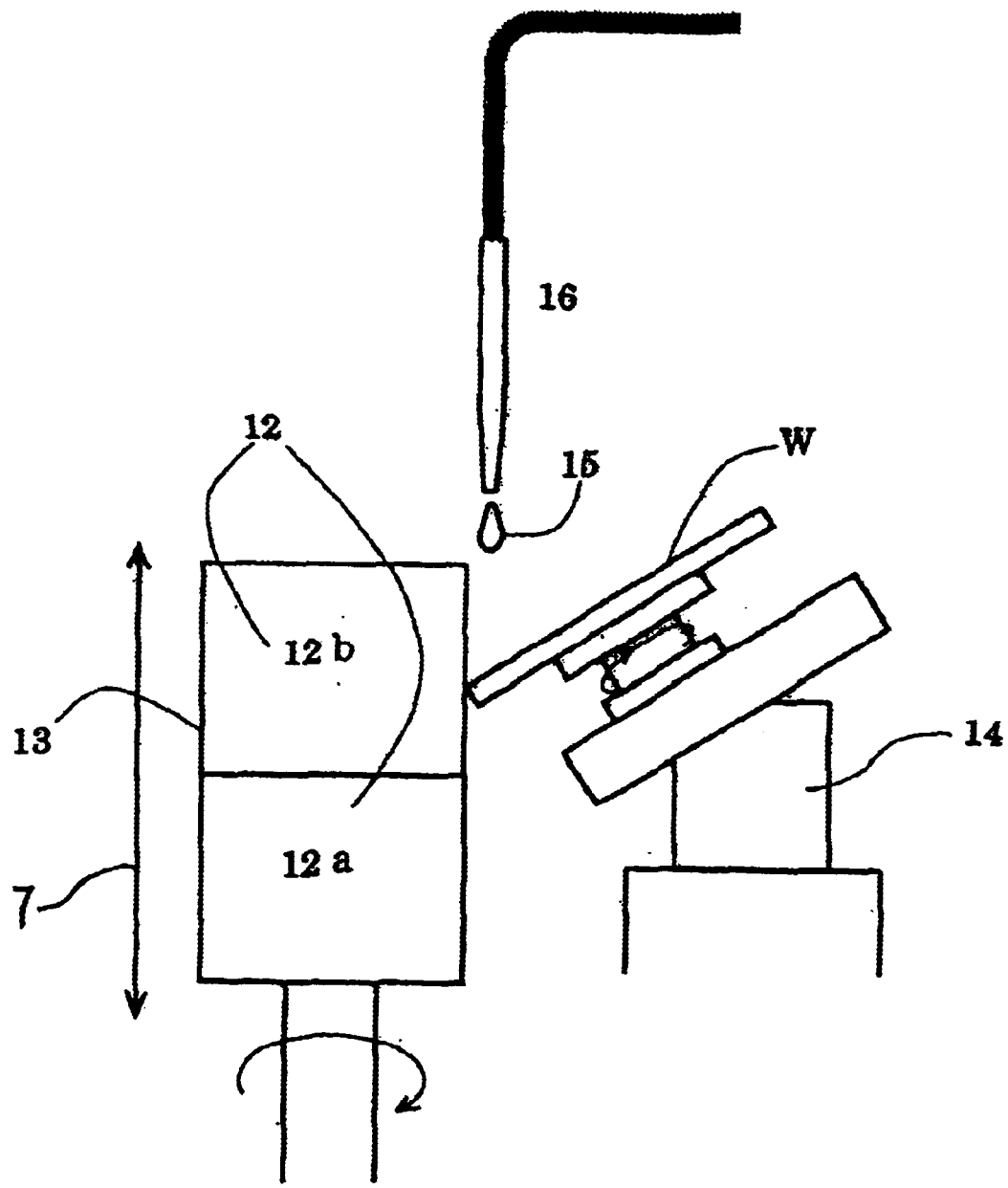
FIG. 2 is a schematic drawing of one illustrative embodiment of apparatus for polishing chamfered peripheral part of wafer employing the present invention.

More specifically as shown in FIG. 2, a polishing cloth 12b having Asker C hardness of 62 as on the upper section and a polishing cloth 12a having Asker C hardness of 72 as on the lower section were affixed to the rotating drum. An alkaline polishing slurry 15 containing colloidal silica of particle size 30 nm was used. The drum was rotated at a rate of 800 rpm.

Using the above described apparatus, the chamfered periphery part of a wafer was first polished at the spot of the polishing cloth of the lower section of the drum having Asker C hardness of 72 at a wafer rotation rate of 45 seconds per a round and then was polished at the spot of the polishing cloth of the upper section of the drum having Asker C hardness of 62 after having moved with the linear moving means. The surface roughness was improved to 5 nm with the total polishing time of 90 seconds, i.e. the first polishing time of 45 seconds at the lower drum section plus the seconds polishing time of 45 seconds at the upper drum section. In this way, the same improvement and time reduction as example 1 could be done.

The apparatus used herein enabled the polishing process by a single apparatus so that the wafer needed not to be transferred and a smaller installation space was required.

EXAMPLE 3

The region around {110} plane of the chamfered peripheral part of a wafer was polished as a first polishing and then the whole chamfered peripheral part was polished on the other condition as a second polishing. The first polishing was performed using two apparatus shown in FIG. 4 having a cloth of unwoven type polishing cloth of Asker c hardness of 62 with slurry containing fumed silica. The region around {110} plane of the chamfered peripheral part of a wafer was polished at a low rate of wafer rotation and with a high pressing pressure to the cloth. The more specifically, the region around {110} plane, i.e. the ±15° angle region from the center spot of <110> direction, of the chamfered peripheral part of a wafer was polished at a 2/3 rate of wafer rotation compared to the other part with a pressing pressure of 1.5 times as strong as the other part so as to improve the roughness of the {110} plane region particularly.

Thus the roughness of the {110} plane was improved up to 15 nm by about 50 second polishing of the first polishing, while that of the chamfered peripheral part of the wafer was improved up to 5 nm by a successive polishing on the same condition as comparative example 2, which was resulted in the time reducing of the whole polishing time to about 80 seconds.

INDUSTRIAL APPLICABILITY

The present invention enables to improve a productivity of a process by reducing a polishing time in a polishing process of the chamfered peripheral part of a wafer.

What is claimed is:

1. A method for polishing the chamfered peripheral part of a wafer with a polishing cloth while supplying a polishing slurry comprising the steps of performing a plurality of processes in sequence, wherein the plurality of processes includes at least two polishing processes performed on at least a first portion of the chamfered peripheral part of the wafer, and wherein the plurality of processes comprises a first polishing process to polish a first portion of the chamfered peripheral part of the wafer and a second polishing process in which the whole chamfered peripheral part of the wafer is polished for finishing.

2. A method for polishing the chamfered peripheral part of a water according to claim 1, wherein the first portion of the chamfered peripheral part of the wafer is a portion corresponding to a {110} plane.

3. A method for polishing the chamfered peripheral part of a wafer with a polishing cloth while supplying a polishing slurry comprising the steps of performing a plurality of processes in sequence, wherein the plurality of processes includes at least two polishing processes performed on at least a first portion of the chamfered peripheral part of the wafer, and wherein among the plurality of processes, a polishing rate is changed by changing at least one of a hardness of a polishing cloth and a particle size of the abrasives in the polishing slurry.

4. A method for polishing the chamfered peripheral part of a wafer according to claim 3, wherein the hardness of a polishing cloth used in a second polishing process is softer than that in a first polishing process.

5. A method for polishing the chamfered peripheral part of a wafer according to claim 4, wherein the chamfered peripheral part of the wafer is pushed, while the wafer is rotated, against a rotating drum with a plurality of polishing clothes having different hardnesses affixed thereon and is rubbed with the cloths while supplying a slurry to the contact position of the cloths.

6. A method for polishing the chamfered peripheral part of a wafer according to claim 3, wherein a particle size of the abrasives in the polishing slurry in a second polishing process is smaller than that in a first polishing process.

7. A method for polishing the chamfered peripheral part of a wafer according to claim 3, wherein the chamfered peripheral part of the wafer is pushed, while the wafer is rotated, against a rotating drum with a plurality of polishing clothes having different hardness affixed thereon and is rubbed with the cloths while supplying a slurry to the contact position of the cloths.

8. A method for polishing the chamfered peripheral part of a wafer with a polishing cloth while supplying a polishing slurry comprising the steps of performing a plurality of processes in sequence, wherein the plurality of processes includes at least two polishing processes performed on a least a first portion of the chamfered peripheral part of the wafer, and wherein the chamfered peripheral part of the wafer is pushed, while the wafer is rotated, against a rotating drum with a plurality of polishing cloths having different hardnesses affixed thereon and is rubbed with the cloths while supplying a slurry to the contact position of the cloths.

9. An apparatus for polishing the chamfered peripheral pert of a wafer having a rotating drum with a polishing cloth affixed thereon, a wafer rotating part which processes the chamfered peripheral part of the wafer against the rotating drum while rotating the wafer thereon, and a nozzle which supplies polishing slurry to the contact area of the polishing cloth on the chamfered peripheral part of the wafer comprising:

a rotating drum with a plurality of polishing cloths having different values of hardness affixed thereon; and a relative linear moving means which relatively moves a polishing spot on the cloths in the direction parallel to the affixed plane of the cloths, wherein the moving range of the relative linear moving means is at least a wafer moving distance between the polishing spots of different cloths of said plurality of polishing cloths.

10. An apparatus for polishing the chamfered peripheral part of a wafer according to claim 9, wherein the direction of variation of the plurality of affixed polishing cloths and the moving direction of the relative moving means are in the direction of the axis of rotation of the rotating drum.

11. An apparatus for polishing the chamfered peripheral part of a wafer according to claim 9, wherein the values of hardness of the cloths affixed to the rotating drum are varied at a plurality of steps in the direction of the aids of the rotating drum in order to vary the values of hardness of the cloths at each polishing spot of the chamfered peripheral part of the wafer by means of the relative linear moving means.

* * * * *